(12) United States Patent
Wenk

(10) Patent No.: US 7,899,308 B2
(45) Date of Patent: Mar. 1, 2011

(54) EVAPORATION DEVICE WITH RECEPTACLE FOR RECEIVING MATERIAL TO BE EVAPORATED

(75) Inventor: Karl-Heinrich Wenk, Bad Nauheim (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 963 days.

(21) Appl. No.: 11/445,941

(22) Filed: Jun. 2, 2006

(65) Prior Publication Data

US 2007/0092233 A1 Apr. 26, 2007

(30) Foreign Application Priority Data

Oct. 26, 2005 (EP) ..................................... 05023355

(51) Int. Cl.
*C23C 14/00* (2006.01)
*C23C 16/00* (2006.01)
(52) U.S. Cl. ......................................... 392/389; 118/726
(58) Field of Classification Search .......... 392/386–389, 392/478–498; 118/726, 727
See application file for complete search history.

(56) References Cited

U.S. PATENT DOCUMENTS

| | | | | |
|---|---|---|---|---|
| 2,440,135 | A * | 4/1948 | Alexander | 427/248.1 |
| 4,093,757 | A | 6/1978 | Barraud et al. | |
| 4,224,896 | A | 9/1980 | Barraud et al. | |
| 4,871,115 | A * | 10/1989 | Hessey | 239/136 |
| 4,956,995 | A * | 9/1990 | Harrold et al. | 73/146 |
| 4,962,725 | A | 10/1990 | Heinz et al. | |
| 5,223,038 | A | 6/1993 | Kleyer | |
| 5,539,857 | A * | 7/1996 | McGrevy | 392/484 |
| 5,652,022 | A | 7/1997 | Achtner et al. | |
| 6,189,806 | B1 | 2/2001 | Klemm et al. | |
| 2005/0061244 | A1 | 3/2005 | Hein | |
| 2006/0162662 | A1* | 7/2006 | Sato et al. | 118/726 |

FOREIGN PATENT DOCUMENTS

| | | |
|---|---|---|
| DE | 39 22 187 A1 | 1/1991 |
| DE | 198 43 818 A1 | 3/2000 |
| DE | 198 48 177 A1 | 4/2000 |
| EP | 0 494 340 A1 | 7/1992 |
| EP | 0 756 020 A1 | 1/1997 |
| EP | 1 493 836 A1 | 1/2005 |
| GB | 2 342 929 A | 4/2000 |
| JP | 10008241 | 1/1998 |
| JP | 2001279425 | 10/2001 |
| JP | 2004214185 | 7/2004 |
| RU | 2 051 200 C1 | 12/1995 |
| SU | 873869 | 10/1981 |

* cited by examiner

*Primary Examiner* — Sang Y Paik
(74) *Attorney, Agent, or Firm* — Fulbright & Jaworski L.L.P.

(57) ABSTRACT

The invention relates to an evaporator device with a receptacle for holding material to be evaporated. With this evaporator device an oil film can be applied onto specific sites of a sheet to be coated, this sheet being coated with aluminum or zinc in a further step. At the sites at which the oil film is located, no aluminum or zinc is deposited. With the aid of a rod valve, precise application of the oil onto the sheet is ensured. This rod valve is driven by a stepping motor, which can release percentage fractions of oil vapor.

9 Claims, 4 Drawing Sheets

EVAPORATION DEVICE WITH RECEPTACLE FOR RECEIVING MATERIAL TO BE EVAPORATED

BACKGROUND AND SUMMARY OF THE INVENTION

This application claims priority from European Patent Application No. 050 23 355 filed Oct. 26, 2005, incorporated herein by reference in its entirety.

The invention relates to an evaporation device.

Oil evaporators are for example required for producing capacitors. Herein dielectrics, for example synthetic sheets, are provided with a metal layer. To avoid negative consequences for the capacitor following electric sparkovers, metal-free strips are provided on the synthetic sheet. These metal-free strips are generated thereby that at specific sites an oil film is applied onto the synthetic sheet. The metal vapor, preferably aluminum, subsequently applied onto the synthetic sheet, cannot become attached in place at those sites at which the oil film is located.

An evaporator device with a nozzle is disclosed in JP 10008241. In this document the material to be evaporated is evaporated in a crucible, wherein it escapes via a nozzle and migrates in the direction toward the substrate where it lastly condenses. By means of a valve the quantity of the escaping vapor can be controlled. However, this device is solely employed for evaporating metals.

A device for producing metal-free strips in sheet webs coated under vacuum, in particular for capacitors, is furthermore known, which comprises a tubular receptacle for accepting a separating agent, for example of oil (DE 39 22 187 A1). In the tubular receptacle closed by circular disk-shaped end parts, is located a heating rod, all around of which flows oil. In the receptacle is furthermore located a vapor outlet tube, one end of which projects above the oil level and at whose other end is provided an outlet nozzle. The outlet nozzle is herein located beneath the oil reservoir.

A device for evaporating oil is furthermore known, with the oil being disposed in a tube-like vessel (JP 2001 279425). This vessel has several openings arranged in a row, from which the vapor can escape.

In another device the oil is located in an elongated tank (JP 2004-214185). This tank has several openings which are arranged in a row and which assume the form of a nozzle bar. By means of this nozzle bar it is possible to coat very large areas.

A vaporisation device is known comprising a container as well as a seal-off device and a jet body (DE 198 48 177 A1). With this device the container is connected to the seal-off device and the seal-off device is connected to the jet body via a supply line.

A method for localized application of a parting means with a vaporizer onto moving substrates is also known (EP 1 493 836). This vaporizer comprises two chambers arranged one above the other and connected via a channel. The material to be vaporized is disposed in the lower chamber and can pass in the upper chamber through the channel. By means of a voltage controlled proportional valve the quantity of vapor passing in the upper chamber per time unit can be controlled.

The present invention addresses the problem of providing an evaporator device for the evaporation of oil, which comprises a seal-off device on the nozzle.

The problem is resolved according to the present invention.

The invention consequently relates to an evaporator device with a receptacle for holding material to be evaporated. With this evaporator device an oil film can be applied onto specific sites of a sheet to be coated, wherein this sheet is coated in a further step with aluminum or zinc. At those sites at which the oil film is disposed, no aluminum or zinc is deposited. With the aid of a rod valve precise application of the oil onto the sheet is ensured. This rod valve is driven by a stepping motor, which can release oil vapor in percentage fractions.

With this evaporator device substrates, preferably metallized synthetic films, can be coated with a solid or liquid mixture of saturated or unsaturated hydrocarbons. However, the use of fully synthetic oils is also possible. Therein a synthetic sheet, as shown in JP 2004-214185, can be guided by means of rollers over the evaporator device described here.

With this evaporator device the metal layer or the layers on the synthetic sheet are uniformly coated, since it is possible to meter the oil vapor. Subsequent coating of the oil layer with further materials utilizing this evaporator device also does not present any problems.

Thereby that beneath the outlet nozzle a seal-off device is disposed, the quantity of escaping oil vapor can be regulated. It is ensured that oil vapor does not continuously escape from the unit, especially since the seal-off device can also be closed completely. Therewith the escape of oil vapor is no longer possible. This has in particular the advantage that the heating process does not need to be interrupted, if, for a short time, no substrate is moved over the evaporator device.

A further advantage lies therein that the pollution through escaping oil vapor is reduced to a minimum.

The loss of oil through continuous evaporation is therewith considerably decreased.

An embodiment example of the invention is depicted in the drawing and will be described in the following in further detail.

DETAILED DESCRIPTION

Figure 1:
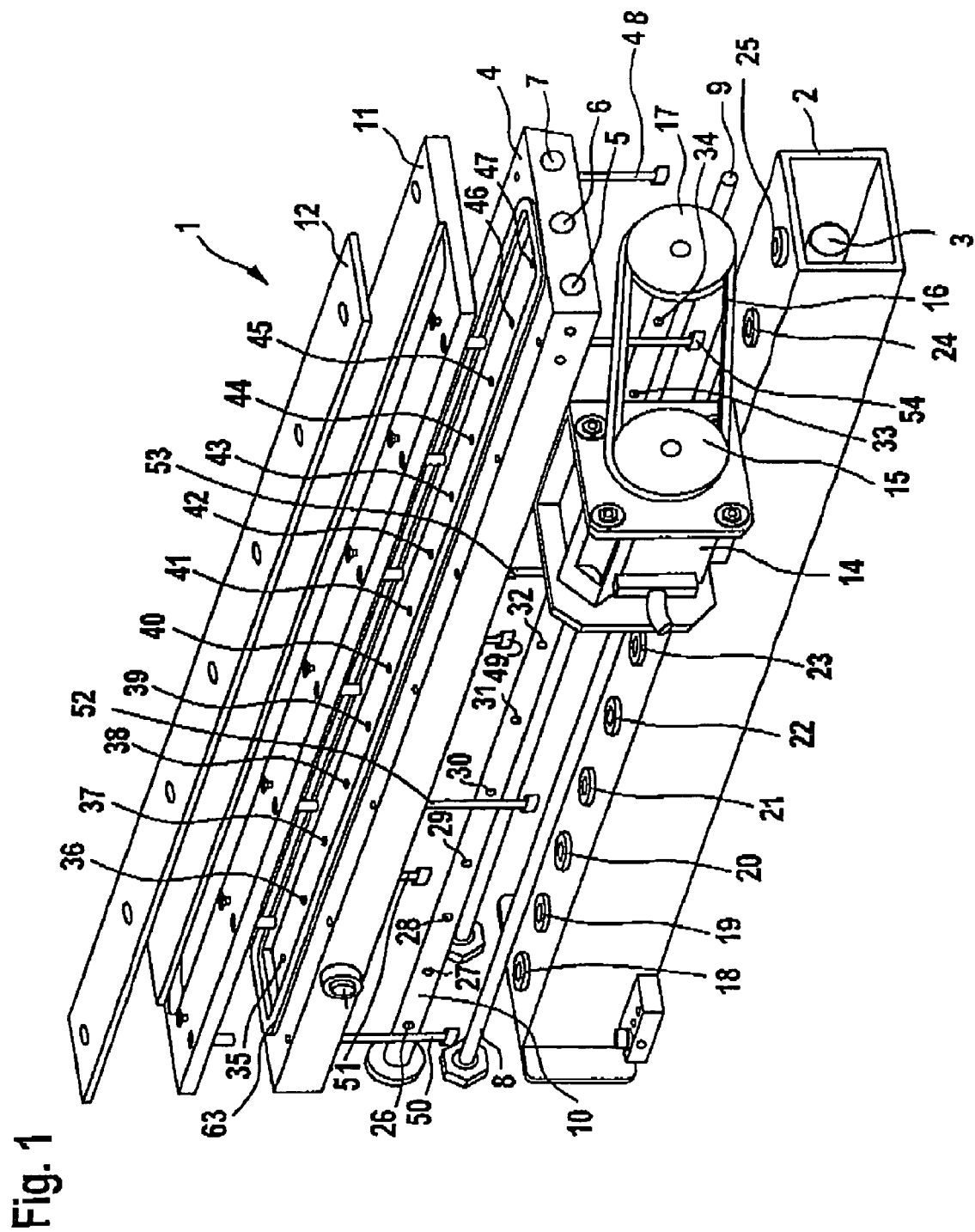
FIG. 1 is a perspective exploded view of an evaporator device.

FIG. 1 shows an exploded view of an evaporator device 1 according to the invention. This evaporator device 1 comprises an oil receptacle 2, in which is located a heating rod 3. Above the oil receptacle 2 is provided a valve plate 4 with three longitudinal bores 5, 6, 7. In the longitudinal bores 5 and 7 are located heating rods 8, 9, while in the longitudinal bore 6 is located a rod valve 10. The heating rods 8, 9 or the rod valve 10 are shown in FIG. 1 outside of the valve plate 4. Above the valve plate 4 is located a nozzle plate 11, on which rests a fine adjustment plate 12. By 14 is denoted a stepping motor, which drives a first wheel 15, which, via a coupling element 16, for example a chain or a V-belt, drives a second wheel 17. The preferred embodiment here is a chain. With this second wheel 17 is connected the one end of rod valve 10 which is rotatable about its longitudinal axis with the aid of the stepping motor 14.

On the top side of oil receptacle 2 are located several openings, through which the oil vapor can escape from the oil receptacle 2. These openings are not visible in FIG. 1, only the seals 18 to 25 encompassing them. In the rod valve 10 several throughbores 26 to 34 are provided, whose number corresponds to the number of seals 18 to 25. On the not visible opposite side the rod valve 10 also has throughbores, provided it is a hollow tube. If it is solid, the throughbores 26 to 34 extend through the entire rod valve 10.

The same number of bores 35 to 47 are found above the longitudinal bore 6 in the valve plate 4. A corresponding number of bores is also provided beneath the longitudinal bore 6. However, these bores are not visible in FIG. 1.

If the oil in the oil receptacle 2 is heated by means of the heating rod 3, is arrives through the openings in oil receptacle through the openings, not shown in FIG. 1, on the underside of the valve plate 4 on the rod valve 10 located in the longitudinal bore 6. If the throughbores 26 to 34 of the rod valve 10 are oriented vertically, evaporated material can escape through the rod valve 10 and the corresponding bores 35 to 47 through a gap formed by the fine-adjustment plate 12 and the nozzle plate 11 and be deposited on a substrate above this gap.

By 48 to 54 connecting bolts are denoted, with which the individual parts of the evaporator device 1 are held together.

Figure 2:
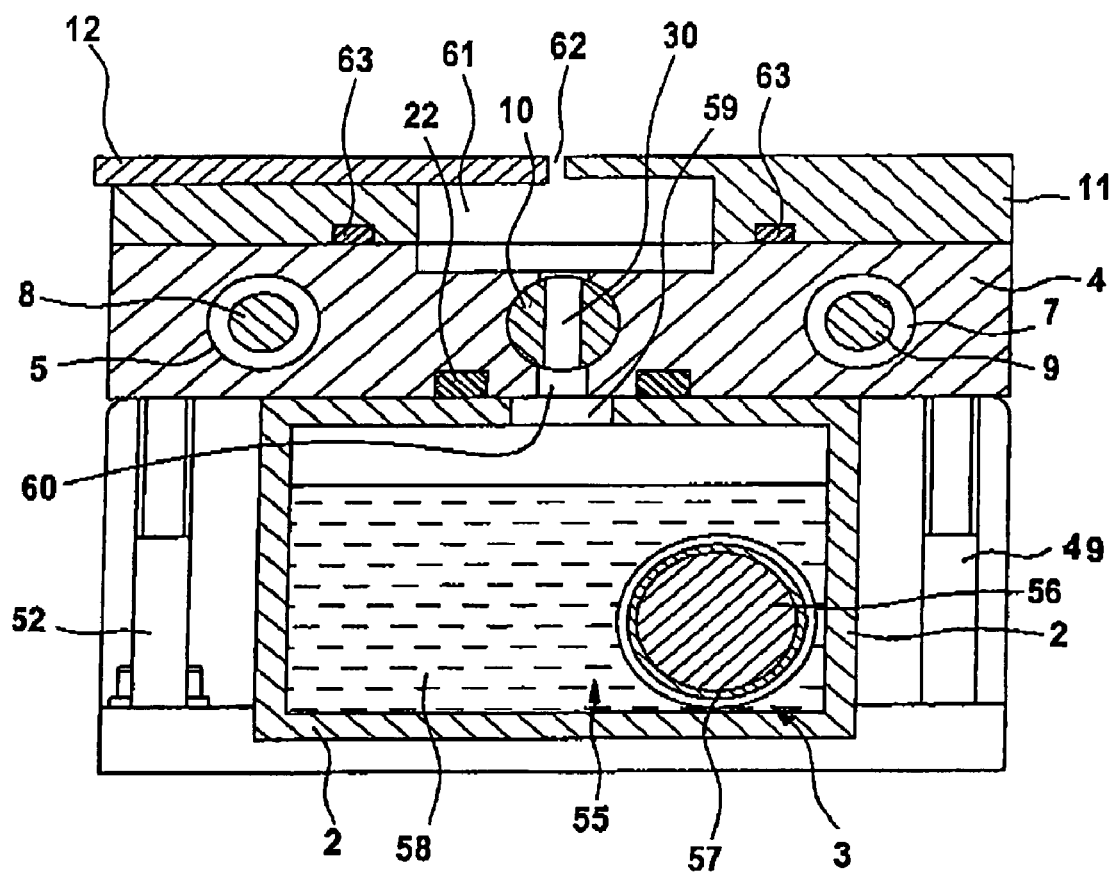
FIG. 2 is a cross section through the evaporator device according to FIG. 1.

FIG. 2 shows a cross section through the evaporator device 1. In the interior space 55 of the oil receptacle 2 is located a heating rod 3, which is comprised of a core 56 and a casing 57. This core 56 can be heated by means of a voltage source. The heating rod 3 is completely encompassed by oil 58. The oil receptacle 2 has several openings on its top side, of which one opening 59 is visible. Above this opening 59 is located one of the annular seals 18 to 25, for example seal 22. Adjoining the opening 59 is a bore 60 in valve plate 4, which, in turn, leads to the bore 30 in rod valve 10. Above this rod valve is located an interspace 61, which has an upper gap opening 62. This gap opening 62 is formed by the nozzle plate 11 and the fine-adjustment plate 12. Between nozzle plate 11 and valve plate 4 is provided a seal 63, which, as evident in FIG. 1, is placed about the entire interspace 61. In the longitudinal bores 5, 7 can again be seen the heating rods 8, 9. These heating rods 8, 9 heat the valve plate 4 to a temperature, at which condensation of the oil in the valve plate 4 is impossible.

In the view of FIG. 2 the rod valve 10 is open, i.e. the evaporated material can pass through the gap opening 62 and reach a, not shown, substrate, which is located above this gap opening 62.

By rotating the rod valve 10 in the clockwise or counter-clockwise direction, the material vapor issuing from the oil receptacle 2 can be more or less throttled. Starting at a specific angle, however at the latest after a rotation by 90 degrees, the material vapor is sealed off completely through the rod valve 10.

Figure 3:
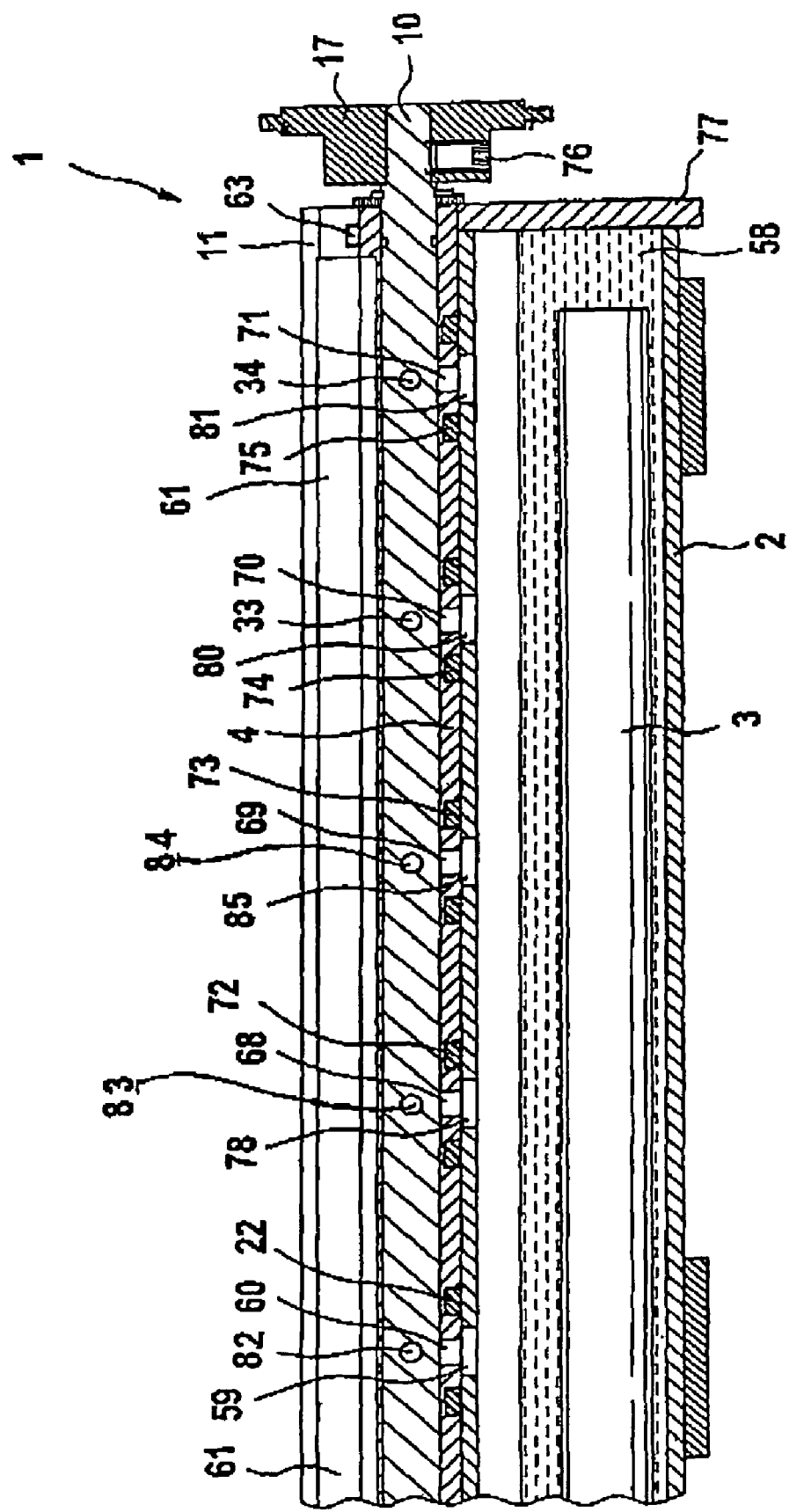
FIG. 3 is a longitudinal section through a portion of the evaporator device according to FIG. 1.

FIG. 3 depicts a portion of the evaporator device 1 shown in FIG. 1, and specifically with the rod valve 10 closed. Herein again the oil receptacle 2 with the heating rod 3 is evident. The throughbores 32 to 34, 82 to 84 in the rod valve 10 extend herein into the plane of drawing, such that the openings 60, 68 to 71 on the underside of the valve plate 4 are closed. Consequently no oil vapor can arrive from the oil receptacle 2 via the holes 59, 78 to 81, 85 or 60, 68 to 71 in the interspace 61 and from there reach the substrate. About the openings 60, 68 to 71 ring seals 22, 72 to 75 are disposed. Furthermore, a set screw 76 can be seen. Via this set screw 76, which for example may be a headless screw, the wheel 17 is fastened on the axle of the rod valve 10. It is moreover evident that the oil receptacle 2 is closed off by a plate 77.

Furthermore is visible in FIG. 3 the wheel 17, on which the preferred embodiment of the coupling element 16, the chain, can be emplaced.

Figure 4:
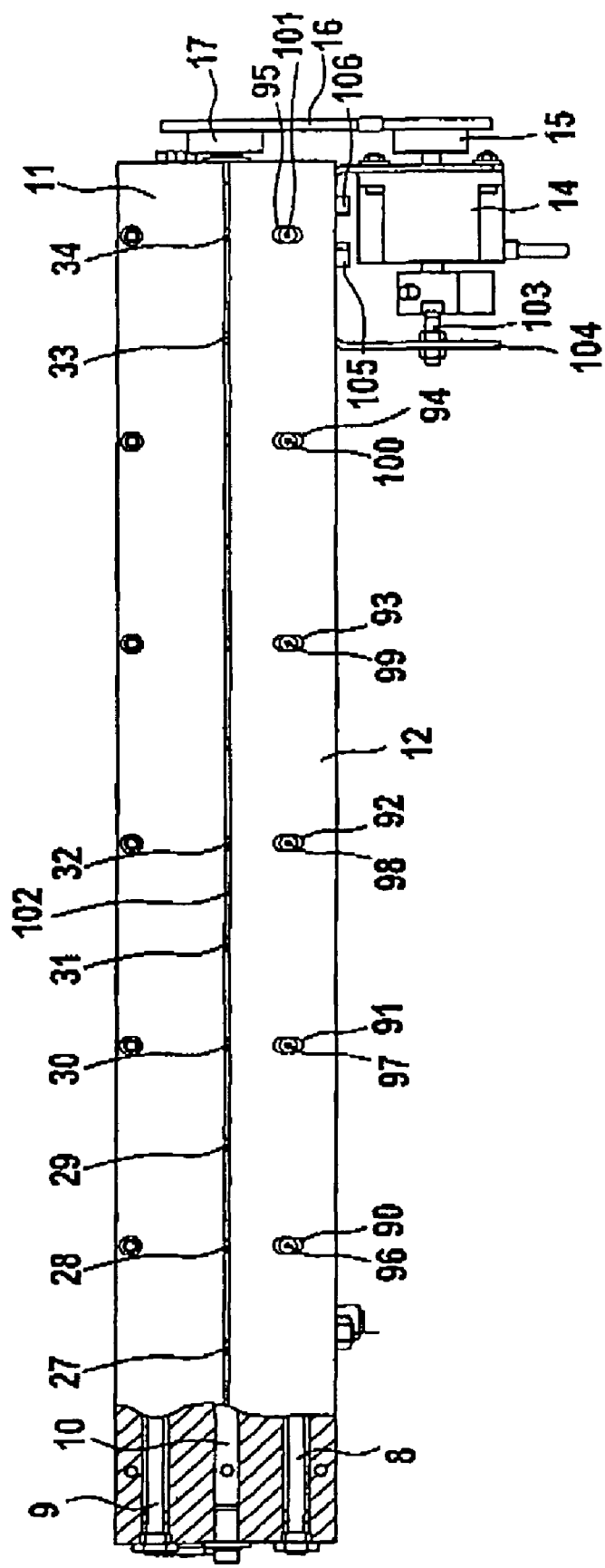
FIG. 4 is a top view onto the evaporator device according to FIG. 1.

FIG. 4 shows a partially broken open top view onto the evaporator device 1 according to FIG. 1. Herein again the nozzle plate 11 with the fine-adjustment plate 12 can be seen as well as the heating rods 8, 9 and the rod valve 10. The wheels 15 and 17, the V-belt 16 and the stepping motor 14 are evident.

The fine-adjustment plate 12 has several elongated holes 90 to 95, through which machine screws 96 to 101 are guided. It becomes hereby possible to displace the fine-adjustment plate 12 such that a gap formed between it and the nozzle plate 11 becomes greater or smaller. Through this gap 102 the vapor can subsequently leave space 61. Below this space 61 the openings 27 to 34 of rod valve 10 are visible.

The stepping motor 14 is fastened with a bolt 103 on a U-shaped metal sheet plate 104, this sheet plate 104, in turn, being connected by means of machine screws 105, 106 with the valve plate 4 not visible in FIG. 4.

It is claimed:

1. An evaporator device comprising:
    a receptacle for holding material to be evaporated;
    a first plate above the receptacle; and
    a second plate above the receptacle, wherein the first plate and the second plate are arranged on substantially the same level,
    the first and second plates being movable relative to each other and establishing a variable slot between them;
    a valve plate arranged between said both plates on one side and said receptacle on the other side, wherein the valve plate comprises a rotatable cylindrical body with a throughbore; and
    an interspace between the plates and said valve plate.

2. An evaporator device as claimed in claim 1, wherein heating rods are provided in the valve plate.

3. An evaporator device as claimed in claim 2, wherein the heating rods maintain the valve plate at a temperature above the boiling point of the oil.

4. An evaporator device as claimed in claim 1, wherein the valve plate rests on the top side of the receptacle and on its underside is provided with a seal, which extends about the opening of the receptacle.

5. An evaporator device as claimed in claim 1, wherein the rotatable cylindrical body is rotatable with a motor.

6. An evaporator device as claimed in claim 5, wherein the motor is coupled with a first wheel, which is coupled via a coupling element with a second wheel.

7. An evaporator device as claimed in claim 5, wherein the coupling element is a chain.

8. An evaporator device as claimed in claim 1, wherein in the receptacle at least one heating tube is disposed.

9. An evaporator device as claimed in claim 8, wherein the heating tube is comprised of a core and a casing.

* * * * *